(12) United States Patent
Chi et al.

(10) Patent No.: US 8,470,715 B2
(45) Date of Patent: Jun. 25, 2013

(54) CD BIAS LOADING CONTROL WITH ARC LAYER OPEN

(75) Inventors: Kyeong-Koo Chi, San Jose, CA (US); Jonathan Kim, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 304 days.

(21) Appl. No.: 12/809,021

(22) PCT Filed: Dec. 9, 2008

(86) PCT No.: PCT/US2008/086094
§ 371 (c)(1),
(2), (4) Date: Sep. 2, 2010

(87) PCT Pub. No.: WO2009/085597
PCT Pub. Date: Jul. 9, 2009

(65) Prior Publication Data
US 2010/0323525 A1     Dec. 23, 2010

Related U.S. Application Data

(60) Provisional application No. 61/016,397, filed on Dec. 21, 2007.

(51) Int. Cl.
*H01L 21/302* (2006.01)
*H01L 21/461* (2006.01)

(52) U.S. Cl.
USPC ........... 438/706; 438/707; 438/710; 438/717; 438/723

(58) Field of Classification Search
None
See application file for complete search history.

(56) References Cited

U.S. PATENT DOCUMENTS

| | | | | |
|---|---|---|---|---|
| 5,935,762 A | * | 8/1999 | Dai et al. | 430/312 |
| 2002/0020494 A1 | * | 2/2002 | Yokogawa et al. | 156/345 |
| 2004/0011763 A1 | | 1/2004 | Hirose et al. | |
| 2005/0048785 A1 | | 3/2005 | Kang et al. | |
| 2005/0085087 A1 | | 4/2005 | Okigawa et al. | |
| 2007/0249171 A1 | | 10/2007 | Sung et al. | |

OTHER PUBLICATIONS

Search Report dated Jul. 17, 2009 from International Application No. PCT/US2008/086094.
Written Opinion dated Jul. 17, 2009 from International Application No. PCT/US2008/086094.

* cited by examiner

*Primary Examiner* — Duy Deo
(74) *Attorney, Agent, or Firm* — Beyer Law Group LLP

(57) ABSTRACT

A method for etching a line pattern in an etch layer disposed below an antireflective coating (ARC) layer below a patterned mask is provided. The method includes opening the ARC layer, in which an ARC opening gas comprising CF3I, a fluorocarbon (including hydrofluorocarbon) containing gas, and an oxygen containing gas are provided, a plasma is formed from the ARC opening gas to open the ARC layer, and providing the ARC opening gas is stopped. Line pattern features are etched into the etch layer through the opened ARC layer.

11 Claims, 14 Drawing Sheets

CD BIAS LOADING CONTROL WITH ARC LAYER OPEN

BACKGROUND OF THE INVENTION

The present invention relates to etching an etch layer through a mask during the production of a semiconductor device. More specifically, the present invention relates to CD bias loading control for fine features with opening of an antireflective coating (ARC) layer through a mask during an etching process for the production of semiconductor devices.

During semiconductor wafer processing, features of the semiconductor device are defined in the wafer using well-known patterning and etching processes. In these processes (photolithography), a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Typically, in photolithography steps, one or more antireflective coating (ARC) layers, for example, a bottom antireflective coating (BARC) and/or a dielectric antireflective coating (DARC) layer are provided under a photoresist mask. These layers minimize or eliminate reflections during exposure of the photoresist which may produce standing waves. Such standing waves may result in defects such as sinusoidal "scalloping" of the photoresist sidewalls, or the formation of "feet" at the base of the photoresist layer. Therefore, BARC/DARC layers are generally disposed below a photoresist layer and above other device materials (e.g. $SiO_2$) to be etched through the photoresist mask. BARC/DARC layers may be organic-based or inorganic-based, and are usually composed of different materials than the underlying dielectric material. The BARC layer is usually organic, but an inorganic BARC layer may be composed of titanium nitride (TiN) as well as silicon oxynitride (SiON). The DARC layer may be formed of SiOx.

The critical dimension (CD) uniformity in ultra large scale integrated circuits (ULSI) is a crucial parameter for high performance devices. The CD uniformity in the gate electrode, for example, affects the threshold voltage distribution and the overall yield of the devices. The required CD of the features of a semiconductor device can be met by either controlling the CD of the photolithography or controlling the CD bias during the etch process. The CD bias (also referred to as CD skew) is the difference between a mask CD (before etching) and the CD of the resulting features (after etching). The CD bias accompanied by an etch process depends on the pattern density of the etch features, and generally, such CD bias is greater in an insolated-pattern area than that in a dense-pattern area. In general, the difference depending on a feature pattern is referred to as "loading." The difference in an etch rate depending on the pattern is referred to as "etch-rate loading." The difference in the CD bias depending on the pattern density is referred to as the CD bias loading ("Iso-Dense CD bias loading"). For example, FIGS. 1A and 1B schematically illustrate a patterned mask 10 and an etch layer 12 in a dense area 14 and an isolated area 16, respectively, before an etch process. FIGS. 2A and 2B schematically illustrate the etch layer 12 in the dense area 14 and the isolated area 16, respectively, after the conventional etch process. As shown in the figures, the CD bias, which is the difference between the mask $CD_1$ and the etched feature $CD_2$, is greater in the isolated area (FIG. 2B) than in the dense area (FIG. 2A). In addition, in general, it is more difficult to define a pattern of small CD in the isolated area (for example, a fine line pattern) than the dense area by photolithography. Thus, a greater CD bias loading makes it more challenging to define a small CD in the isolated-pattern area.

SUMMARY OF THE INVENTION

To achieve the foregoing and in accordance with the purpose of the present invention a method for etching a line pattern in an etch layer disposed below an antireflective coating (ARC) layer below a patterned mask is provided. The method includes opening the ARC layer, in which an ARC opening gas comprising $CF_3I$, a fluorocarbon containing gas, and an oxygen containing gas are provided, a plasma is formed from the ARC opening gas to open the ARC layer, and providing the ARC opening gas is stopped. Line pattern features are etched into the etch layer through the opened ARC layer.

In another manifestation of the invention, an apparatus for etching a line pattern in an etch layer disposed below an antireflective coating (ARC) layer below a patterned mask is provided. A plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to at least one electrode, a gas inlet for providing gas into the plasma processing chamber enclosure, and a gas outlet for exhausting gas from the plasma processing chamber enclosure. A gas source is in fluid connection with the gas inlet. The gas source includes an ARC opening gas source including $CF_3I$ source, a fluorocarbon containing gas source, and an oxygen containing gas source, and an etch gas source. A controller is controllably connected to the gas source and at least one RF power source. The controller includes at least one processor, and computer readable media. The computer readable media includes computer readable code for opening the ARC layer, which includes computer readable code for flowing an ARC opening gas comprising $CF_3I$, a fluorocarbon containing gas, and an oxygen containing gas from the $CF_3I$ source, the fluorocarbon containing gas source, and the oxygen containing gas source, respectively, into the plasma chamber, computer readable code for forming a plasma from the ARC opening gas, and computer readable code for stopping the flow of the ARC opening gas. The computer readable media also includes computer readable code for etching line pattern features into the etch layer through the opened ARC.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements, and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
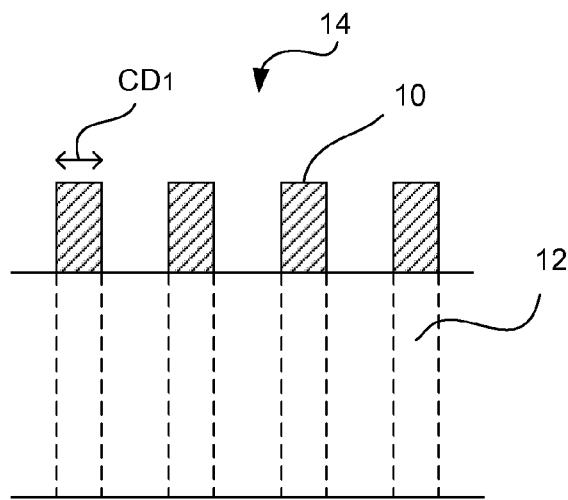
FIGS. 1A and 1B are schematic cross-sectional views illustrating a patterned mask and an etch layer in the dense area and the isolated area, respectively, before a conventional etch process.
Figure 1B:
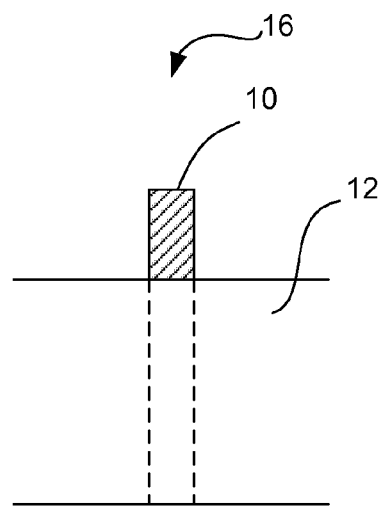
Figure 2A:
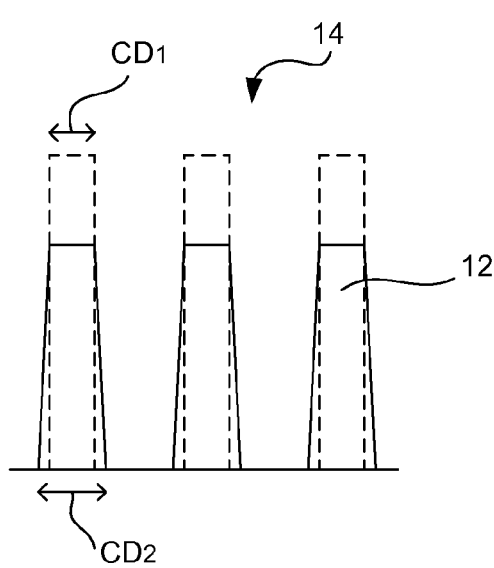
FIGS. 2A and 2B schematic cross-sectional views illustrating the etch layer in the dense area and the isolated area, respectively, after the conventional etch process using the mask in shown in FIGS. 1A and 1B.
Figure 2B:
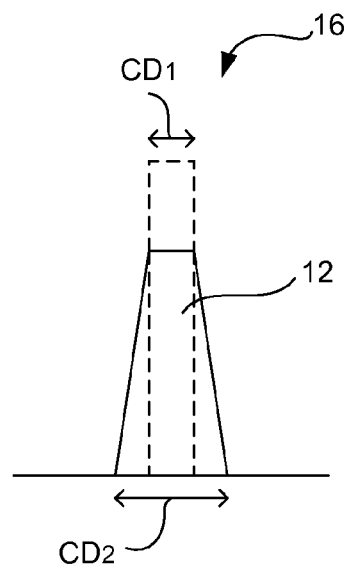
Figure 3:
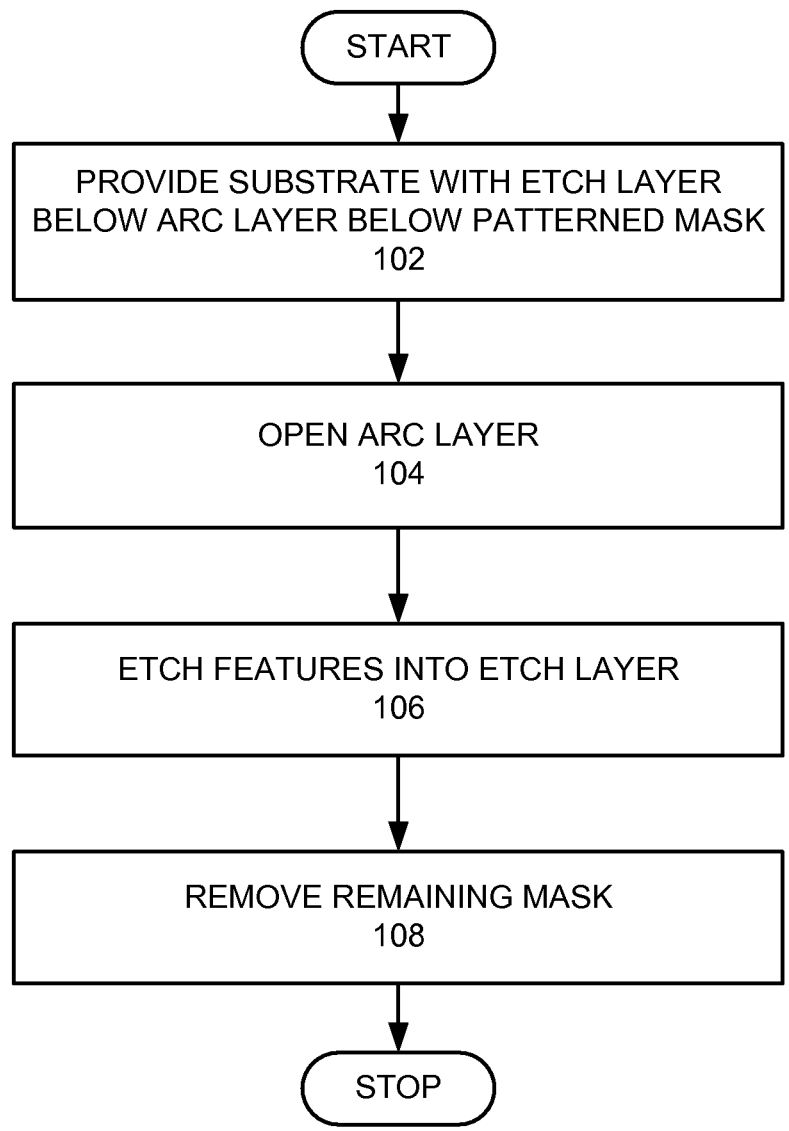
FIG. 3 is a high level flow chart of a process used in an embodiment of the invention.
Figure 4A:
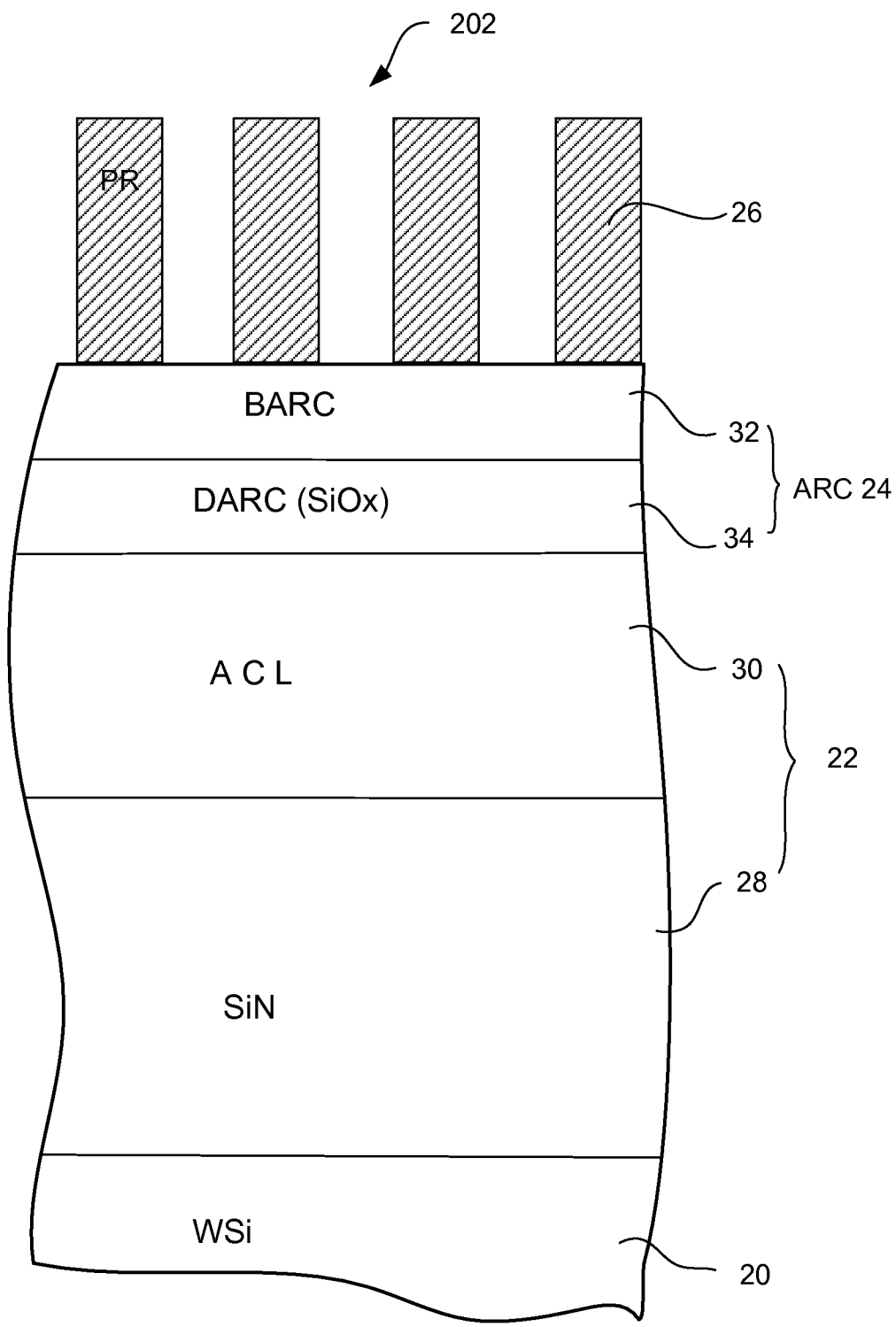
FIGS. 4A and 4B are schematic cross-sectional views illustrating a stack of layers formed on a substrate, including an etch layer disposed below an ARC layer below the patterned mask in the dense area and the isolated area, respectively.
Figure 4B:
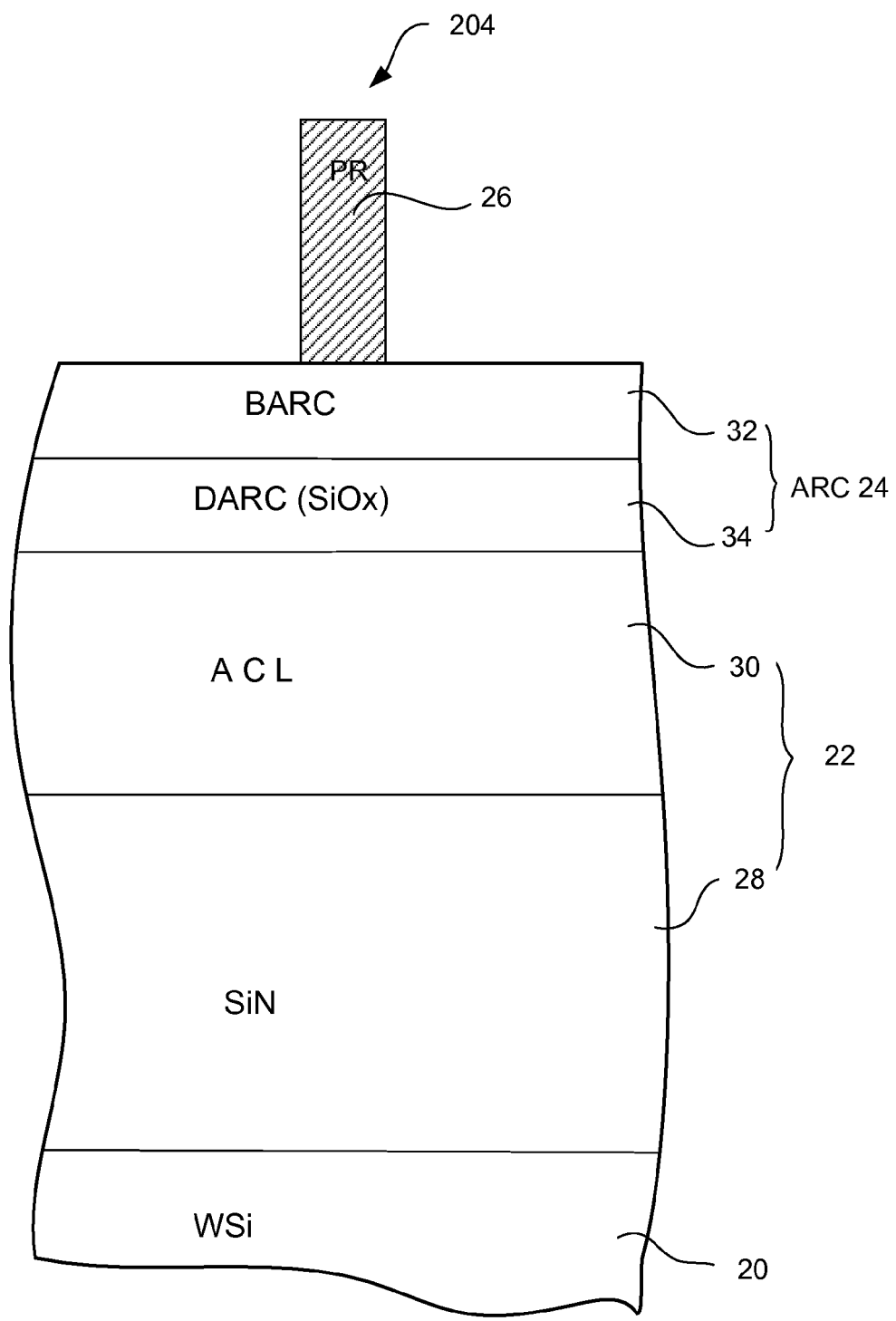

To facilitate understanding, FIG. 3 is a high level flow chart of a process used in an embodiment of the invention. As shown in FIG. 3, a substrate with an etch layer disposed below an antireflective coating (ARC) layer below a patterned mask is provided (step 102). To facilitate understanding of the invention, FIGS. 4A and 4B are schematic cross-sectional views of a stack of layers formed on a substrate 20, including an etch layer 22 disposed below an ARC layer 24 below the patterned mask 26 in the dense area 202 and the isolated area 204, respectively. The patterned mask 26 may be a photoresist (PR) mask. In this example, the mask 26 is a PR mask having a line-space pattern to form a plurality of lines and spaces in the etch layer. The PR mask 26 may be patterned with the immersion 193 nm photolithography. FIG. 4A shows a dense area 202 of the line-space pattern, and FIG. 4B shows an isolated area 204 of the line-space pattern.

In accordance with one embodiment of the present invention, the "dense" area may be defined as an area having periodic line-and-space patterns whose CD depends on the design rule but the ratio of line CD to space CD varies from $1/5$:1 to 5:1, and the "isolated" area may be defined as the space CD adjacent to the said "isolated" feature is 3 times greater than the design rule, where the design rule is defined as half of the pitch in the periodic pattern in the dense area. Here, the line-pattern density is the number of lines (line-space patterns) per unit length perpendicular to the line direction. In an example, the isolated area does not necessarily have a periodic pattern but is provided with a single or a few lines, compared with the dense area of similar dimensions provided with numerous lines. The CD of a line-space pattern is typically the width of lines, and thus reflects the target width of the lines in the respective area in accordance with the circuit design specification. In accordance with one embodiment of the present invention, the patterned mask in the dense area 202 may have a CD about 66 nm and that in the isolated area 204 may have a CD about 77 nm. The CD in the dense area may be in a range of 10 nm to 100 nm, and the CD in the isolated area may be in a range of 10 nm to 100 nm, depending on the circuit design specification. It should be noted that the specific value of the CD does not define the dense or isolated area.

As shown in FIGS. 4A and 4B, the etch layer 22 may include a dielectric layer 28 and an amorphous carbon layer (ACL) 30. The dielectric layer 28 may be made of a silicon oxide based dielectric material such as silicon nitride (SiN), $SiO_2$, or tetora-ethyl-ortho-silicate (TEOS). Amorphous carbon is similar to a polymer, but with less hydrogen and more carbon since it is deposited at high temperature greater than 200° C. by CVD, and thus it is more etch resistant than polymer. The ACL 30 may work as a hardmask in etching the dielectric layer 28. The ARC layer 24 may include a bottom antireflective coating (BARC) layer 32 formed below the PR mask 26, and a dielectric antireflective coating (DARC) layer 34 below the BARC layer 32. These layers minimize or eliminate reflections during exposure of the photoresist. The BARC/DARC layers may be organic-based or inorganic-based, and are usually composed of different materials than the underlying dielectric material. For example, when the BARC layer 32 is carbon-based organic layer, and the upper etch layer (the ACL 30 in this example) is also carbon-based material, an inorganic DARC layer, such as silicon oxide (SiOx), will prevent the etch layer from undesirably being etched during an ARC layer opening process. In a specific example, the stack may have the PR mask 26 with a thickness of about 150 nm, the BARC layer 32 with a thickness of about 60 nm, the DARC layer 34 with a thickness of about 60 nm, the ACL layer 30 with a thickness of about 180 nm, and the dielectric (such as SiN) layer 28 with a thickness of about 200 nm. This structure may be suitable for gate electrodes in semiconductor devices.

Referring back to FIG. 3, the ARC layer 24 is opened (step 104) using the PR mask 26 as an etch mask. Typically the first step of an etch process is to open any ARC layer (or BARC/DARC layers). This is typically a critical step, because the ARC layer acts like a mask for the layers underneath. The photoresist mask generally defines the desired feature sizes. If, after etch, the CD of the ARC layer is wider than the photoresist mask CD (in case of line features), then the final CD of the underlying etch layer may also be wider than desired.

Figure 5:
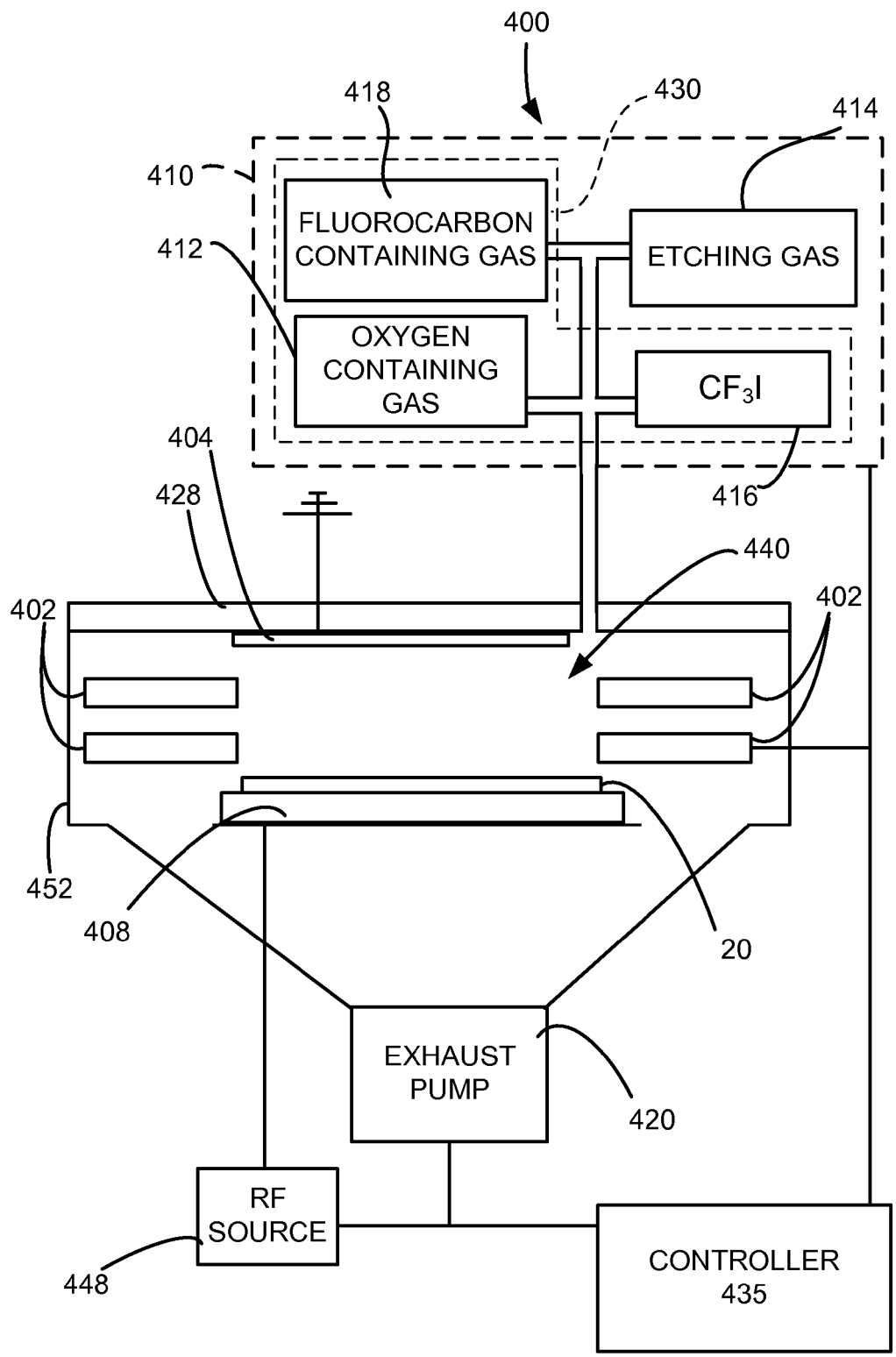
FIG. 5 is a schematic view of a plasma processing chamber that may be used for opening an ARC layer and optionally for etching an etch layer in accordance with one embodiment of the present invention.

FIG. 5 is a schematic view of a plasma processing chamber 400 that may be used for inventive etching. The plasma processing chamber 400 comprises confinement rings 402, an upper electrode 404, a lower electrode 408, a gas source 410, and an exhaust pump 420 connected to a gas outlet. Within plasma processing chamber 400, the substrate 20 (with the stack of layers) is positioned upon the lower electrode 408. The lower electrode 408 incorporates a suitable substrate chucking mechanism (e.g., electrostatic, mechanical clamping, or the like) for holding the substrate 20. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume 440 by the gas source 410 and is exhausted from the confined plasma volume 440 through the confinement rings 402 and an exhaust port by the exhaust pump 420. Besides helping to exhaust the gas, the exhaust pump 420 helps to regulate pressure. In this embodiment, the gas source 410 comprises an ARC opening gas source 430 including a $CF_3I$ source 416, an oxygen containing gas source 412, and a fluorocarbon congaing gas source 418. The gas source 410 may further comprise other gas sources, such as an etching gas source 414 for the subsequent etch processes for the etch layer(s) to be performed in the processing chamber 400.

As shown in FIG. 5, an RF source 448 is electrically connected to the lower electrode 408. Chamber walls 452 surround the confinement rings 402, the upper electrode 404, and the lower electrode 408. The RF source 448 may comprise a 2 MHz power source, a 60 MHz power source, and a 27 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the RF power source 448 connected to the lower electrode, and the upper electrode is grounded. A controller 435 is controllably connected to the RF source 448, exhaust pump 420, and the gas source 410.

Figure 6A:
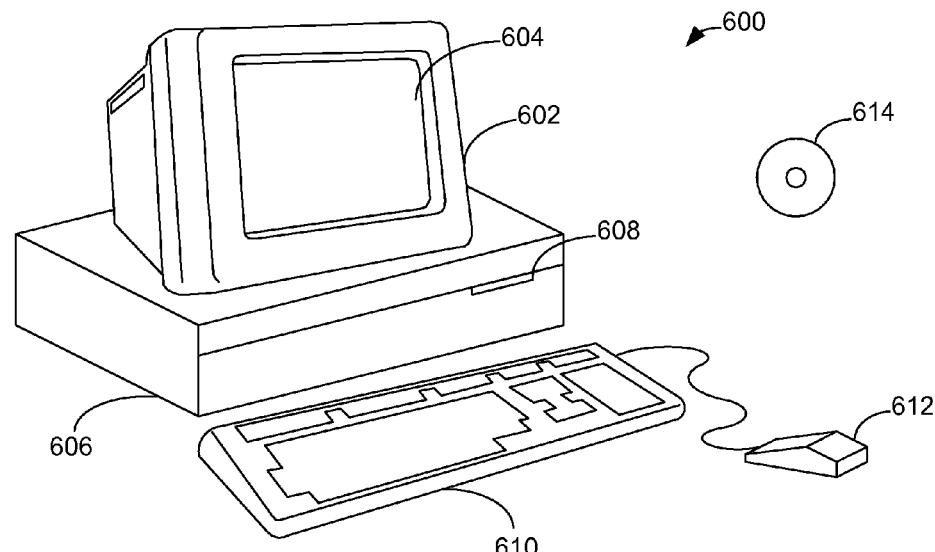
FIGS. 6A and 6B illustrate a computer system, which is suitable for implementing a controller used in embodiments of the present invention.
Figure 6B:
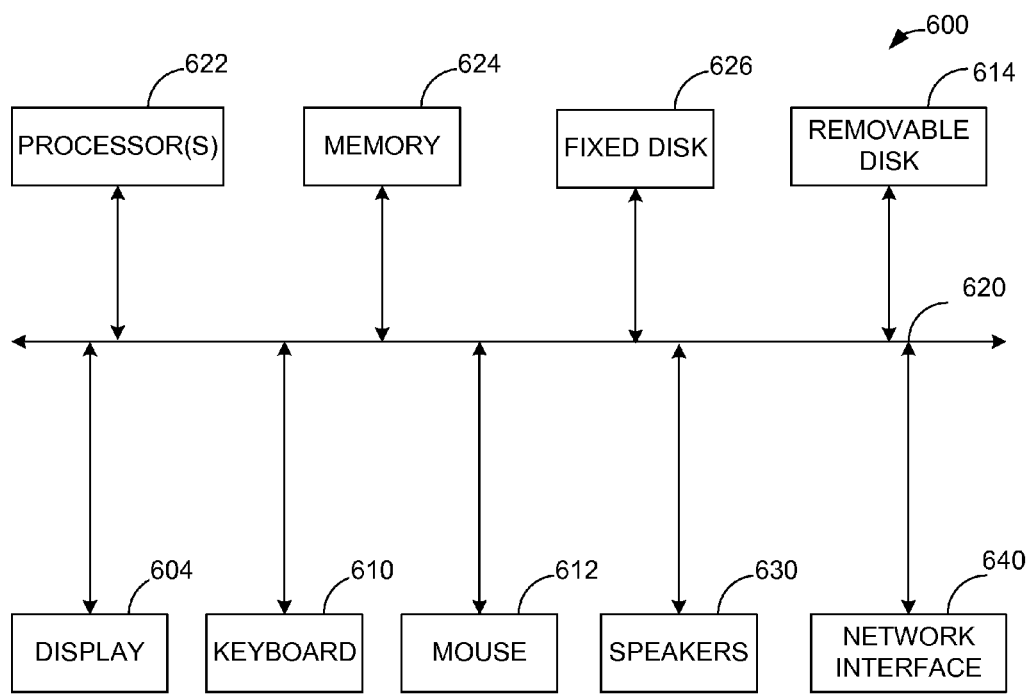

FIGS. 6A and 6B illustrate a computer system 600, which is suitable for implementing a controller 435 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 600 includes a monitor 602, a display 604, a housing 606, a disk drive 608, a keyboard 610, and a mouse 612. Disk 614 is a computer-readable medium used to transfer data to and from computer system 600.

FIG. 6B is an example of a block diagram for computer system 600. Attached to system bus 620 are a wide variety of subsystems. Processor(s) 622 (also referred to as central processing units, or CPUs) are coupled to storage devices, including memory 624. Memory 624 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 626 is also coupled bi-directionally to CPU 622; it provides additional data storage capacity and may also include any of the computer-readable media described below. Fixed disk 626 may be used to store programs, data, and the like and is typically a secondary storage medium (such as a hard disk) that is slower than primary storage. It will be appreciated that the information retained within fixed disk 626 may, in appropriate cases, be incorporated in standard fashion as virtual memory in memory 624. Removable disk 614 may take the form of the computer-readable media described below.

CPU 622 is also coupled to a variety of input/output devices, such as display 604, keyboard 610, mouse 612, and speakers 630. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 622 optionally may be coupled to another computer or telecommunications network using network interface 640. With such a network interface, it is contemplated that the CPU might receive information from the network, or might output information to the network in the course of performing the above-described method steps. Furthermore, method embodiments of the present invention may execute solely upon CPU 622 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 7:
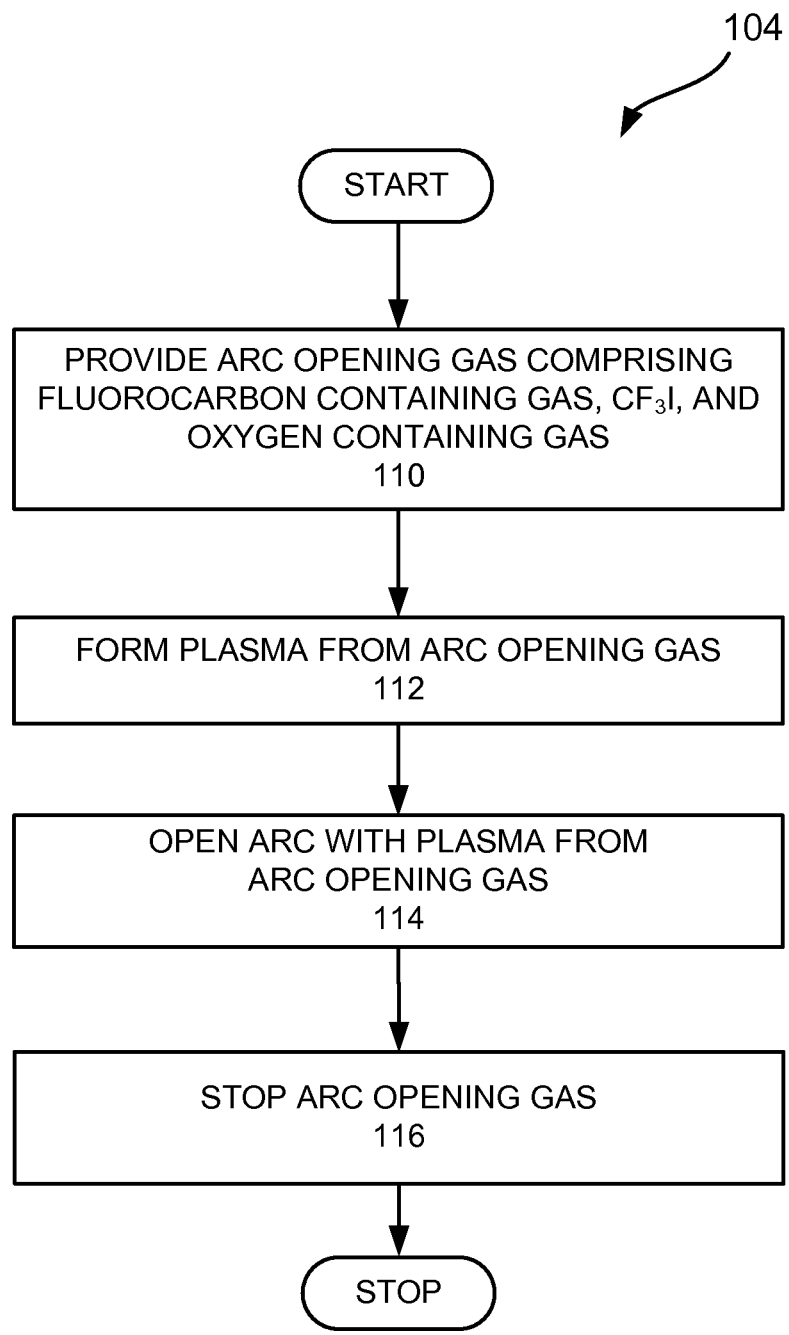
FIG. 7 is a detailed flow chart for the ARC layer opening in accordance with one embodiment of the present invention.

FIG. 7 is a detailed flow chart for the ARC layer opening (step 104 in FIG. 3), which may be performed using the plasma processing chamber 400 described above. The substrate 20 having the stack is provided in the plasma processing chamber 400. Prior to opening the ARC layer, the patterning of the mask 26 may also be performed in the same processing chamber 400. In the ARC layer opening process (step 104), an ARC opening gas comprising a fluorocarbon containing gas, $CF_3I$, and an oxygen containing gas is provided (step 110), as shown in FIG. 7. In accordance with one embodiment of the present invention, a new gas, $CF_3I$ is introduced as an additive to the ARC opening step. $CF_3I$ has been known to have a low global warming potential (GWP). Concerning the global warming effect of perfluorocarbons (PFCs) which are generally used in etching of silicon dioxide and silicon nitride, it has been proposed to possibly substitute PFCs with $CF_3I$. However, in this invention, $CF_3I$ is introduced as an additive, not as a main etchant, in an ARC layer opening step to improve the CD bias loading. As described above, the CD bias loading has been problem in dielectric etch processes for small features. After years of research and experiments for various etchants and additives, Applicants finally found that using $CF_3I$ in the ARC layer opening as an additive, not an etchant for the dielectric layer etch process, unexpectedly improved the iso-dense CD bias loading for the dielectric etch.

In this specification and the claims, the term "fluorocarbon" means to include fluorocarbon and hydrofluorocarbon which is a type of fluorocarbon containing hydrogen. In one embodiment of the present invention, the fluorocarbon containing gas may contain at least one of $CF_4$ or $CHF_3$. More generally, the fluorocarbon containing gas may contain fluorocarbon and/or hydrofluorocarbon components, for example, $CF_4$, $CH_3F$, $CH_2F_2$, and the like. In a specific example, the pressure in the plasma chamber is set at 100 mTorr, and the ARC opening gas including about 150 sccm $CF_4$, about 20 sccm $CHF_3$, about 50 sccm $CF_3I$, and about 5-10 sccm $O_2$ is provided. More generally, it is preferable that $CF_3I$ has about 1 to 50% of the total flow of the etchant gas. Preferably, $CF_3I$ has about 2-40% of the total flow of the etchant gas. More preferably, $CF_3I$ has about 10-25% of the total flow of the etchant gas.

Figure 8A:
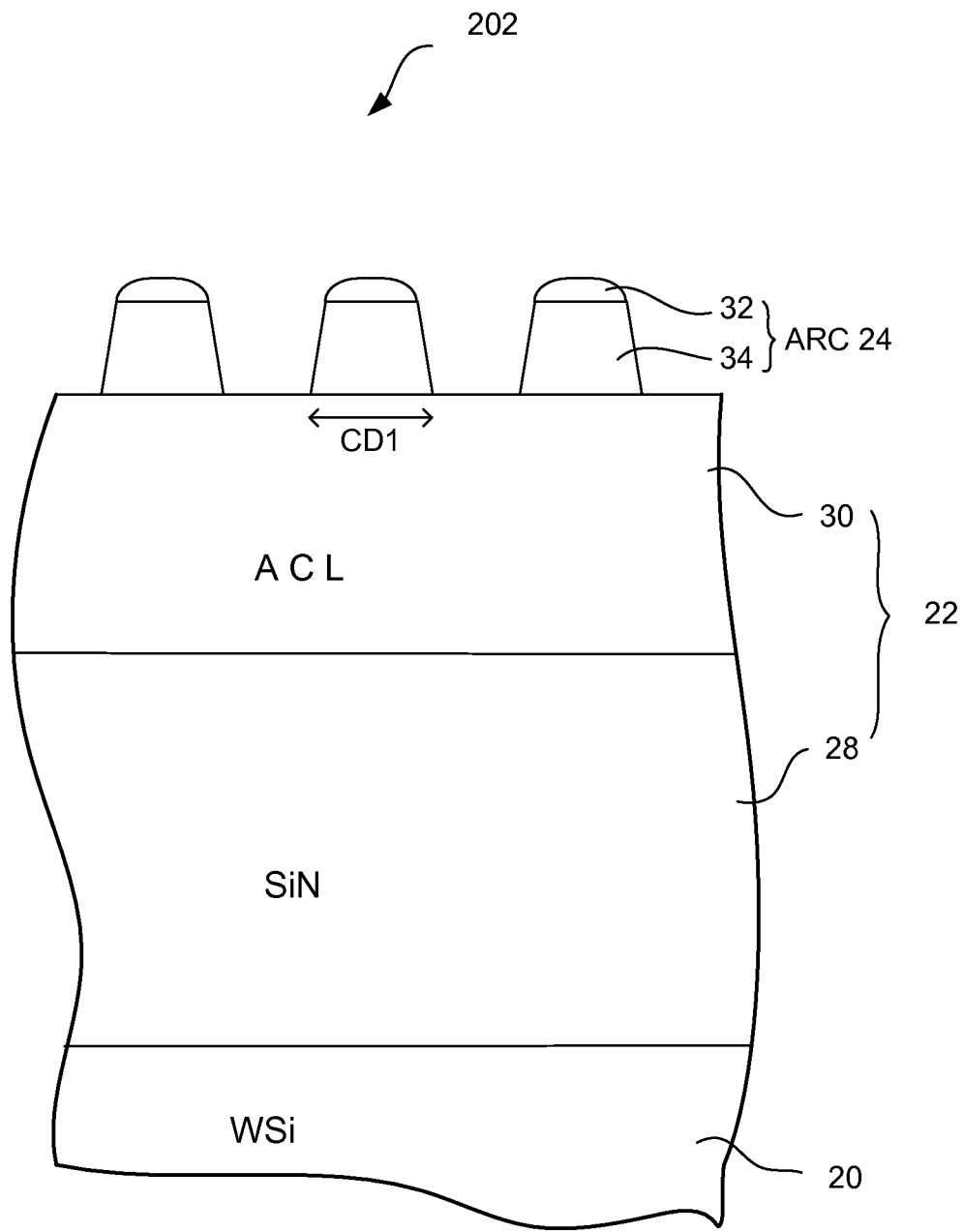
FIGS. 8A and 8B are schematic cross-sectional views of the stack of layers after the ARC opening step in the dense area and the isolated area, respectively.
Figure 8B:
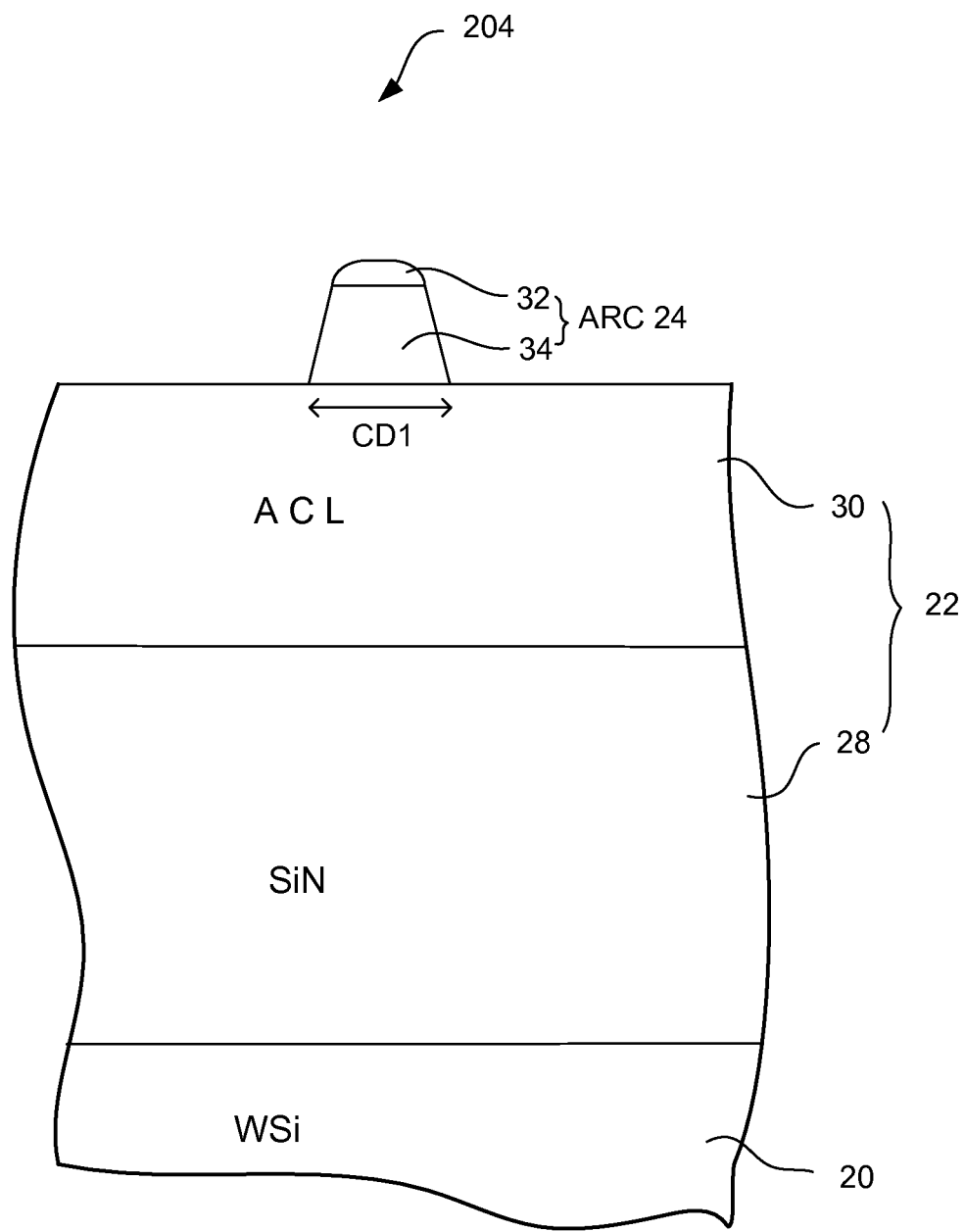

Then, a plasma is formed from the ARC opening gas (step 112) so as to open the ARC layer (step 114). In this example, the RF source provides 500 Watts at 27 MHz for about 240 seconds. After opening the ARC layer, the ARC opening gas flow is stopped (step 116). FIGS. 8A and 8B are schematic cross-sectional views of the stack of layers after the ARC opening step 104 in the dense area 202 and the isolated area 204, respectively. According to one example, the CD (CD1) after the ARC opening step is about 83 nm ($CD1_{Dense}$) in the dense area 202, and 95 nm ($CD1_{Iso}$) in the isolated area 204.

Figure 9A:
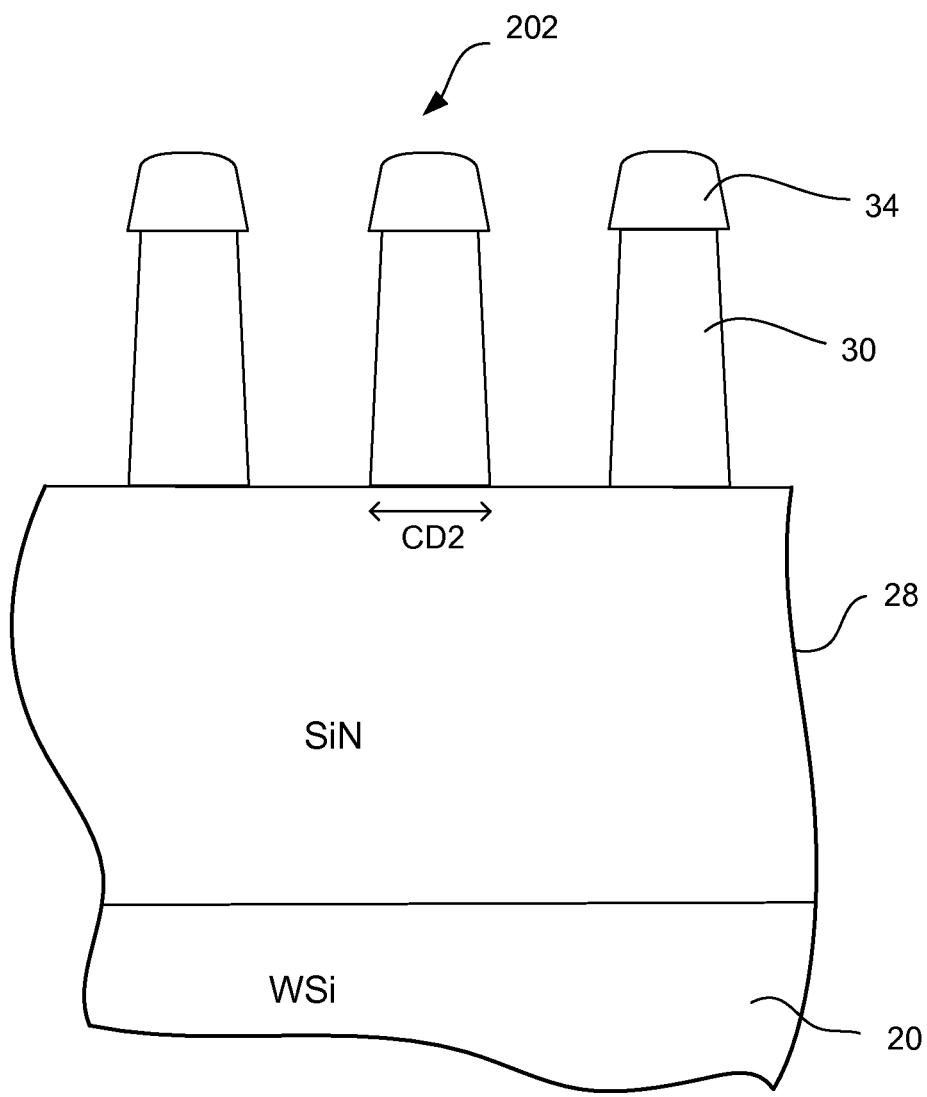
FIGS. 9A and 9B are schematic cross-sectional views of the stack of layers after the ACL etching step in the dense area and the isolated area, respectively.
Figure 9B:
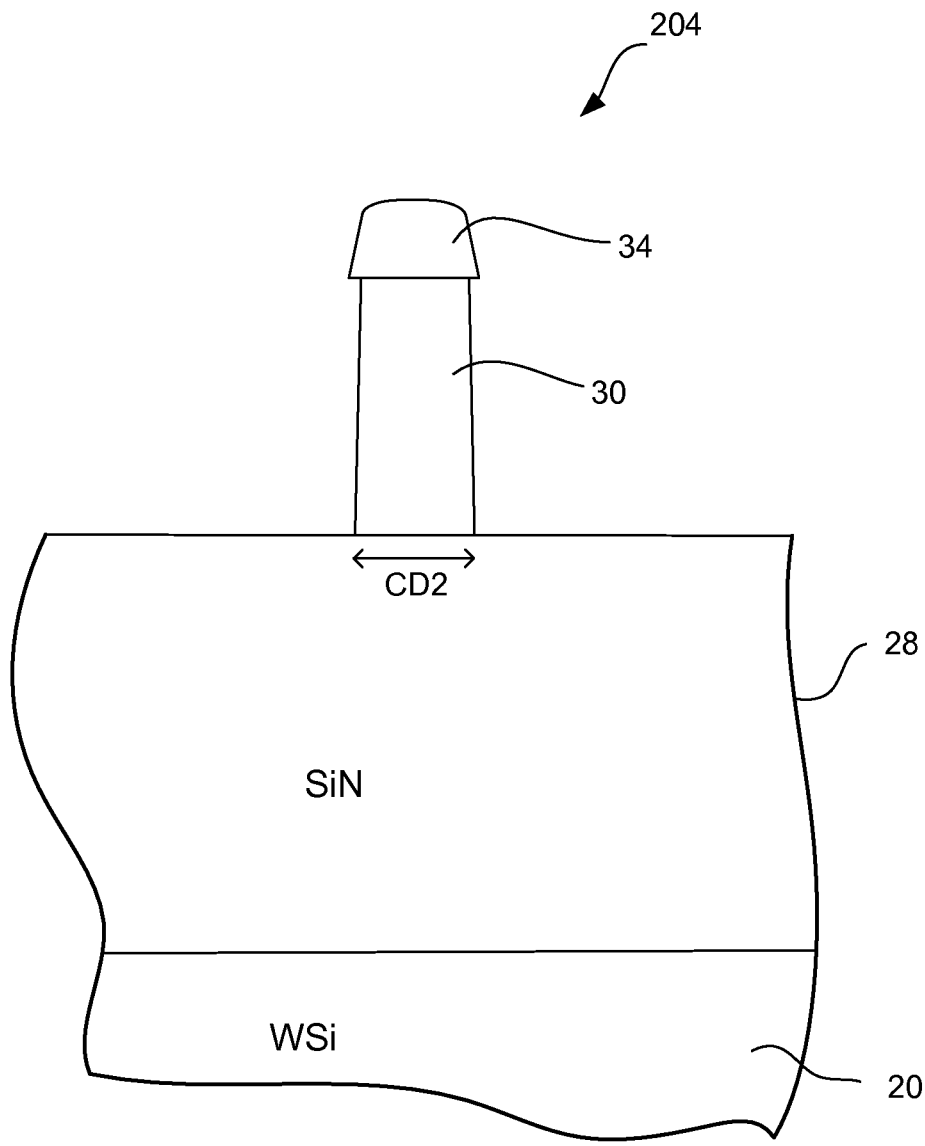

In accordance with an embodiment of the invention, as shown in FIG. 3, features may be etched into the etch layer 22 (step 106) using the same plasma processing chamber 400 that used for opening the ARC layer. For example, the ACL 30 may be etched using the opened ARC layer 24 as a mask. For example, such ACL etch may use chemistry including about 200 sccm $O_2$ under the chamber pressure of 15 mTorr. The RF power source provides 700 Watts at 60 MHz. FIGS. 9A and 9B are schematic cross-sectional views of the stack of layers after the ACL etching step in the dense area 202 and the isolated area 204, respectively. According to the example, the CD (CD2) after the ACL etching is about 69 nm ($CD2_{Dense}$) in the dense area 202, and 83 nm ($CD2_{Iso}$) in the isolated area 204.

Figure 10A:
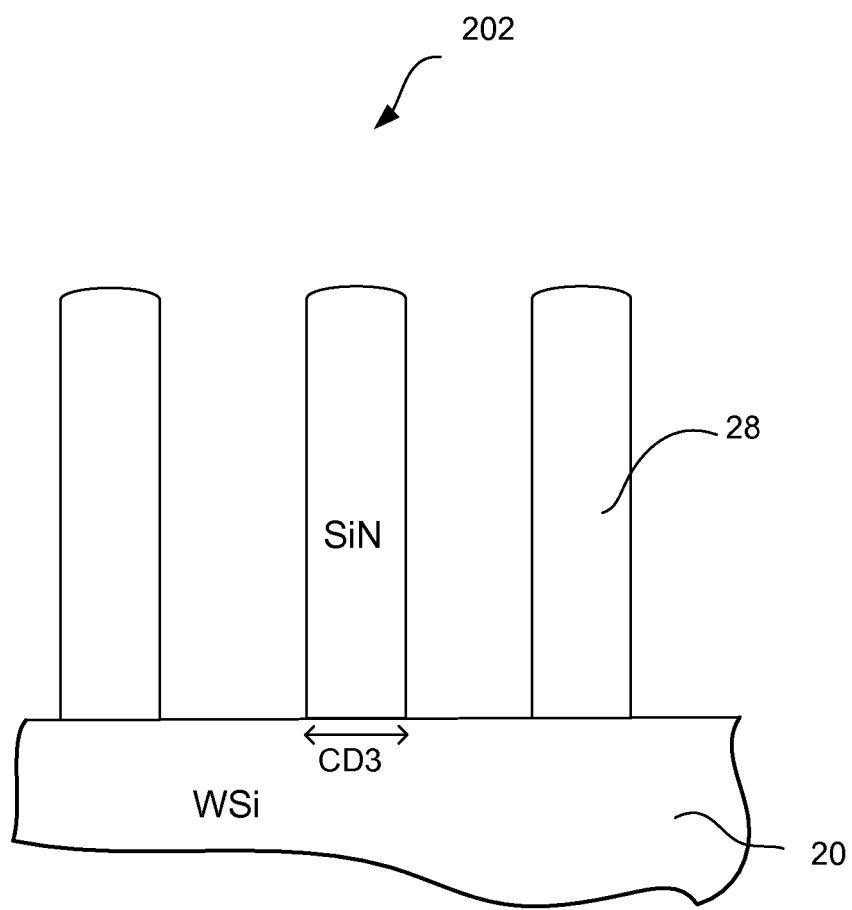
FIGS. 10A and 10B are schematic cross-sectional views of the stack of layers after the dielectric etch and ashing in the dense area and the isolated area, respectively.
Figure 10B:
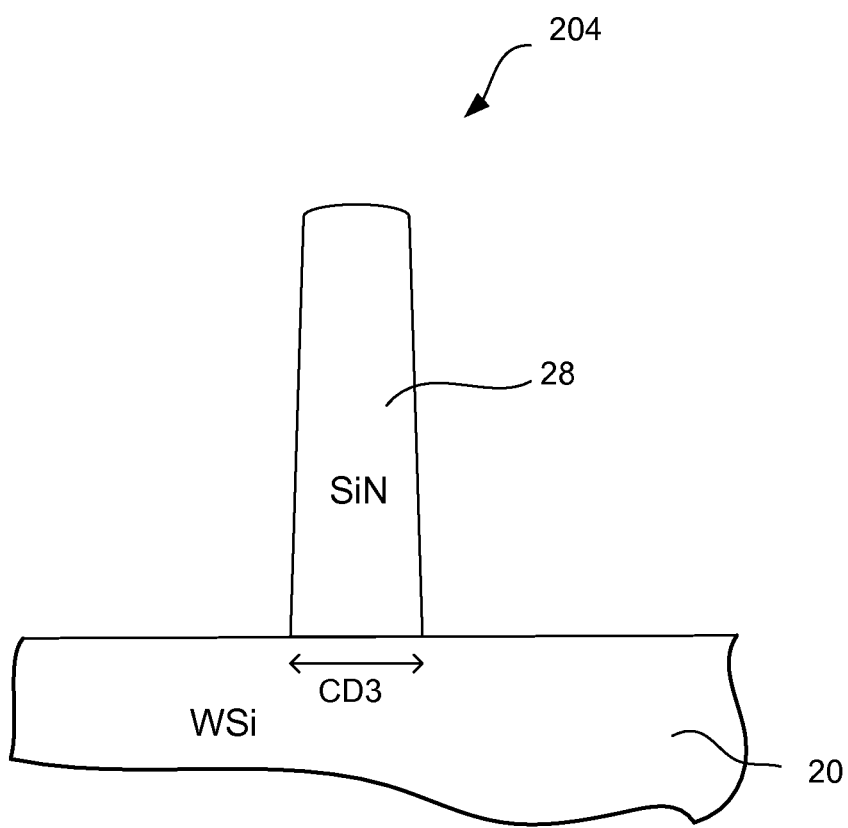

Then, the dielectric layer 28 may be etched to form features using the patterned ACL 30 as an etch mask. For example, the dielectric etch may use chemistry including about 400 sccm $CF_4$, about 26 sccm $CHF_3$, and about 26 sccm $O_2$ under the chamber pressure of 70 mTorr. The RF power source provides 1200 Watts at 60 MHz. In this example, the patterned ACL 30 may be considered as a hardmask for the dielectric etch. Thus, any remaining mask may be removed (step 108) by ashing process or like. FIGS. 10A and 10B are schematic cross-sectional views of the stack of layers after the dielectric etch and ashing in the dense area 202 and the isolated area 204, respectively. According to this example, the CD (CD3) after the dielectric ($SiN_4$ in this example) etch is about 65 nm ($CD3_{Dense}$) in the dense area 202, and 89 nm ($CD3_{Iso}$) in the isolated area 204.

In accordance with one embodiment of the present invention, the plasma is not extinguished from the opening ARC step through the dielectric etch step. Since one or more of the components of the respective gases are common in the successive processes, by changing the flow rate(s), stopping some of the component gas flow(s), and/or adding new component gas flow(s), the etching gas can be changed into that for the next process step without interrupting the entire gas flow or extinguishing the plasma. For example, if the etch layer includes a dielectric layer such as SiN without ACL, the etching gas for the dielectric etch can be provided by increasing the gas flow rate for a fluorocarbon containing gas (such as $CF_4$, $CHF_3$) and an oxygen containing gas, and stopping $CF_3I$ from the ARC opening gas. The plasma generated by the ARC opening gas is maintained by the subsequent etching gas. It should be noted that the power and/or frequency of the RF source and the chamber pressure are also changed in accordance with the specific process requirements.

As mentioned above, the CD bias loading is defined as the difference in the CD bias between the dense area and the isolated area (CD Bias Loading=CD $Bias_{Iso}$-CD $Bias_{Dense}$). Each CD Bias is the difference in the CD before and after the etch process (CD $Bias_{Dense}$=$CD_{Initial\ Dense}$-$CD_{Final\ Dense}$; CD $Bias_{Iso}$=$CD_{Initial\ Iso}$-$CD_{Final\ Iso}$). Here, "Initial" means before the etching process of interest, and "Final" means after the etching process of interest. Thus, $$CD\ \text{Bias Loading} = CD\ Bias_{Iso} - CD\ Bias_{Dense} =$$
$$CD_{Initial\ Iso} - CD_{Final\ Iso} - (CD_{Initial\ Dense} - CD_{Final\ Dense}) =$$
$$CD_{Initial\ Iso} - CD_{Initial\ Dense} - (CD_{Final\ Iso} - CD_{Final\ Dense}) \equiv$$
$$\Delta_{Initial} - \Delta_{Final}$$

Here, $\Delta$ is the difference in the CD between the dense area and the isolated area.

According to the above-mentioned example, after the ARC opening process, $\Delta_{ARC}$ is 12 nm; after the ACL etch process, $\Delta_{ACL}$ is 14 nm; and after the dielectric ($SiN_4$) etch process (after ashing), $\Delta_{SiN4}$ is 24 nm. Since the initial PR mask CD is 66 nm in the dense area 202 and 77 nm in the isolated area 204, $\Delta_{PR}$ is 11 nm. Therefore, in accordance with the embodiment of the present invention, the CD loading as to the dielectric etch process using the patterned mask 26 is $\Delta_{SiN4}$-$\Delta_{PR}$=12 nm.

For comparison, the following results are obtained from a conventional dielectric etch process with the same $\Delta_{PR}$=11 nm using a conventional ARC opening gas. In this referenced example, the conventional ARC opening gas contains 200 sccm $CF_4$ and 20 sccm $CHF_3$ (without $CF_3I$ additive). The subsequent ACL etch process, dielectric process, and ashing are performed under the same conditions. The resulting CD's are: CD1 after the ARC opening is about 74 nm ($CD1_{Dense}$) in the dense area and 99 nm ($CD1_{Iso}$) in the isolated area; CD2 after the ACL etching is about 58 nm ($CD2_{Dense}$) in the dense area and 80 nm ($CD2_{Iso}$) in the isolated area; and CD3 after the dielectric ($SiN_4$ in this example) etch is about 52 nm (CD1 Dense) in the dense area, and 87 nm ($CD3_{Iso}$) in the isolated area. Thus, according to the conventional dielectric etch process, after the ARC opening process, $\Delta_{ARC}$ is 25 nm; after the ACL etch process, $\Delta_{ACL}$ is 22 nm; and after the dielectric ($SiN_4$) etch process (after ashing), $\Delta_{SiN4}$ is 35 nm, resulting, the CD loading as to the dielectric etch process $\Delta_{SiN4}$-$\Delta_{PR}$=24 nm. It should be noted, however, that in this conventional etching example, the CD in the dense area is about 52 nm, not 66 nm.

Figure 11:
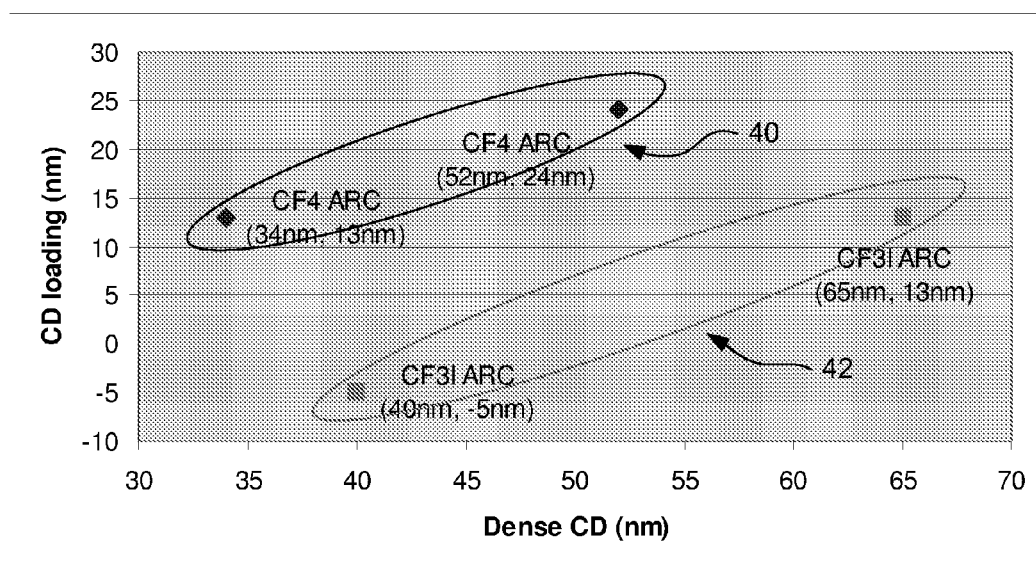
FIG. 11 is a schematic diagram illustrating examples of the CD bias loading for conventional dielectric etch and the novel dielectric etch in accordance with one embodiment of the present invention.

FIG. 11 schematically illustrates examples of the CD bias loading for conventional dielectric etch (with conventional CF4-based ARC opening gas) 40 and the novel dielectric etch (with $CF_3I$-added ARC opening gas) 42 in accordance with one embodiment of the present invention. The CD bias loading is plotted with respect to the CD of the dense area, i.e., the width of lines, which is referred to as "the dense CD." It should be noted that the dense patterns with different dense CD's have the same number of lines per area (line density), but the CDs (line width) are different. As shown in FIG. 11, compared with the conventional CD bias loading for the same dense area CD, the CD bias loading according to embodiments of the present invention is improved approximately 20 nm. It should be noted that the examples and numbers are all illustrative only, and not intended to be limiting the scope of the present invention in any way.

Generally speaking, it is believed that the aspect ratio affects the CD bias loading. Without being bound by the theory, it is believed that the ratio of ions to neutrals reaching the surface of the feature will depend on the aspect ratio of the space between the features. More specifically, the number of ions reaching the surface of the features anisotropically has a weak dependency on the aspect ratio, while the number of neutrals will depend more strongly on the aspect ratio because their motion is basically isotropic. It is believed that if more neutrals come to the surface, the resulting line CD becomes larger, which is the main mechanism of CD bias loading. With respect to the line width in the isolated area (iso CD), if the number of neutrals contributing to deposition in the plasma is reduced, the iso feature may have smaller CD (and thus smaller CD bias). Although the resulting dense CD (CD bias) will also decrease, it is found that the decrease of iso CD bias is faster than the dense CD bias by controlling the neutrals in the plasma. That is, the smaller CD bias loading is achieved if it is allowed to have the dense CD be small. In accordance with embodiments of the invention, the CD bias loading is reduced/improved by not significantly affecting the dense CD.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a line pattern in an etch layer disposed below an antireflective coating (ARC) layer below a patterned mask, the method comprising:
   opening the ARC layer, comprising:
   providing an ARC opening gas comprising CF3I, a fluorocarbon containing gas, and an oxygen containing gas;
   forming a plasma from the ARC opening gas to open the ARC layer; and stopping providing the ARC opening gas; and
   etching line pattern features into the etch layer through the opened ARC layer;
   wherein CF3I has about 1 to 50% of a total flow of the ARC opening gas.

2. The method as recited in claim 1, wherein the etch layer is a dielectric layer.

3. The method as recited in claim 1, wherein the plasma is not extinguished from the opening the ARC layer through the etching line pattern features.

4. A The method for etching a line pattern in an etch layer disposed below an antireflective coating (ARC) layer below a patterned mask, the method comprising:
   opening the ARC layer, comprising:
   providing an ARC opening gas comprising CF3I, a fluorocarbon containing gas, and an oxygen containing gas;
   forming a plasma from the ARC opening gas to open the ARC layer;
   stopping providing the ARC opening gas by stopping the CF3I while continuing providing the fluorocarbon containing gas and the oxygen containing gas such that the plasma is maintained;
   etching line pattern features into the etch layer through the opened ARC layer, the etching the line pattern features comprising: further continuing providing the fluorocarbon containing gas and the an oxygen containing gas as an etching gas; maintaining the plasma by the etching gas; and stopping providing the etching gas;
   wherein CF3I has about 1 to 50% of a total flow of the ARC opening gas.

5. A method for etching a line pattern in an etch layer disposed below an antireflective coating (ARC) layer below a patterned mask, the method comprising:
   opening the ARC layer, comprising:
   providing an ARC opening gas comprising $CF_3I$, a fluorocarbon containing gas, and an oxygen containing gas;
   forming a plasma from the ARC opening as to open the ARC layer; and
   stopping providing the ARC opening gas; and
   etching line pattern features into the etch layer through the opened ARC layer,
   wherein the patterned mask is a photoresist (PR) mask having a line-space pattern, and wherein $CF_3I$ has about 1 to 50% of a total flow of the ARC opening gas thereby reducing CD bias loading between a dense area and an isolated area of the line pattern features of the etch layer.

6. The method as recited in claim 1, wherein the ARC layer includes at least one of:
   a bottom antireflective coating (BARC) layer; or
   a dielectric antireflective coating (DARC) layer.

7. The method as recited in claim 1, wherein the fluorocarbon containing gas includes at least one of:
   $CF_4$; or
   $CHF_3$.

8. The method as recited in claim 1, wherein $CF_3I$ has about 1 to 50% of a total flow of the ARC opening gas.

9. The method as recited in claim 1, wherein $CF_3I$ has about 2 to 40% of a total flow of the ARC opening gas.

10. The method as recited in claim 1, wherein $CF_3I$ has about 10-25% of a total flow of the ARC opening gas.

11. The method as recited in claim 1, wherein ARC layer includes an organic layer.

* * * * *